United States Patent
Ok et al.

(10) Patent No.: US 10,615,257 B2
(45) Date of Patent: Apr. 7, 2020

(54) PATTERNING METHOD FOR NANOSHEET TRANSISTORS

(71) Applicant: International Business Machines Corporation, Armonk, NY (US)

(72) Inventors: Injo Ok, Loudonville, NY (US); Balasubramanian Pranatharthiharan, Watervliet, NY (US); Wei Wang, Yorktown Heights, NY (US); Kevin W. Brew, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 16/124,873

(22) Filed: Sep. 7, 2018

(65) Prior Publication Data

US 2020/0083326 A1 Mar. 12, 2020

(51) Int. Cl.
*H01L 29/06* (2006.01)
*H01L 21/8238* (2006.01)
(Continued)

(52) U.S. Cl.
CPC ...... *H01L 29/0673* (2013.01); *H01L 21/0337* (2013.01); *H01L 21/31051* (2013.01); *H01L 21/31058* (2013.01); *H01L 21/32136* (2013.01); *H01L 21/32139* (2013.01); *H01L 21/823807* (2013.01); *H01L 21/823821* (2013.01); *H01L 21/823828* (2013.01); *H01L 21/823878* (2013.01); *H01L 27/0924* (2013.01); *H01L 29/42392* (2013.01); *H01L 29/66545* (2013.01);
(Continued)

(58) Field of Classification Search
CPC ......... H01L 21/32136; H01L 21/32139; H01L 21/0337; H01L 21/823821; H01L 29/0673
See application file for complete search history.

(56) References Cited

U.S. PATENT DOCUMENTS

| 8,252,696 B2 * | 8/2012 | Lu ..................... H01L 21/31116 438/714 |
| 9,130,059 B2 | 9/2015 | Perng et al. |

(Continued)

OTHER PUBLICATIONS

J. Zhang et al., "High-k Metal Gate Fundamental Learning and Multi-VT Options for Stacked Nanosheet Gate-All-Around Transistor," IEEE International Electron Devices Meeting (IEDM), Dec. 2-6, 2017, 4 pages.

*Primary Examiner* — Victoria K. Hall
(74) *Attorney, Agent, or Firm* — Vazken Alexanian; Ryan, Mason & Lewis, LLP

(57) ABSTRACT

A semiconductor device includes a first type nanosheet device having a first plurality of nanosheet portions alternately stacked with a first plurality of work function metal layers on a substrate, and a second type nanosheet device having a second plurality of nanosheet portions alternately stacked with a second plurality of work function metal layers on the substrate. The second type nanosheet device is spaced apart from the first type nanosheet device. The semiconductor device also includes a dielectric layer disposed in the space between the first and second type nanosheet devices. The first and second plurality of work function metal layers are directly disposed on the dielectric layer, and bottom surfaces of the directly disposed first and second plurality of work function metal layers are co-planar with each other.

20 Claims, 8 Drawing Sheets

(51) Int. Cl.

| | | |
|---|---|---|
| *H01L 21/3213* | (2006.01) | |
| *H01L 21/3105* | (2006.01) | |
| *H01L 29/66* | (2006.01) | |
| *H01L 21/033* | (2006.01) | |
| *H01L 27/092* | (2006.01) | |
| *H01L 29/423* | (2006.01) | |
| *H01L 21/3065* | (2006.01) | |
| *H01L 21/308* | (2006.01) | |
| *H01L 21/02* | (2006.01) | |
| *H01L 29/49* | (2006.01) | |
| *H01L 21/285* | (2006.01) | |
| *H01L 21/28* | (2006.01) | |

(52) U.S. Cl.
CPC .. *H01L 21/02164* (2013.01); *H01L 21/28079* (2013.01); *H01L 21/28088* (2013.01); *H01L 21/28568* (2013.01); *H01L 29/495* (2013.01); *H01L 29/4966* (2013.01)

(56) References Cited

U.S. PATENT DOCUMENTS

| | | | |
|---|---|---|---|
| 9,263,338 B2 | 2/2016 | Liu et al. | |
| 9,559,018 B2 | 1/2017 | Cai et al. | |
| 9,704,863 B1* | 7/2017 | Cheng | H01L 29/4908 |
| 9,805,988 B1* | 10/2017 | Bentley | H01L 21/823807 |
| 9,881,839 B1* | 1/2018 | Cheng | H01L 29/4908 |
| 9,881,998 B1* | 1/2018 | Cheng | H01L 29/0649 |
| 9,947,804 B1* | 4/2018 | Frougier | H01L 29/78696 |
| 9,997,519 B1* | 6/2018 | Bao | H01L 27/092 |
| 10,038,053 B2* | 7/2018 | Balakrishnan | H01L 21/02164 |
| 10,103,063 B2* | 10/2018 | Cheng | H01L 29/4908 |
| 10,103,065 B1* | 10/2018 | Mochizuki | H01L 21/823842 |
| 10,249,541 B2* | 4/2019 | Cheng | H01L 29/4908 |
| 10,276,452 B1* | 4/2019 | Seshadri | B82Y 10/00 |
| 10,304,936 B2* | 5/2019 | Loubet | H01L 29/42392 |
| 10,332,803 B1* | 6/2019 | Xie | H01L 27/092 |
| 10,332,809 B1* | 6/2019 | Ando | H01L 29/78696 |
| 10,374,034 B1* | 8/2019 | Liu | H01L 29/0669 |
| 10,388,577 B1* | 8/2019 | Cheng | H01L 21/28114 |
| 10,410,933 B2* | 9/2019 | Xie | H01L 29/775 |
| 2005/0282369 A1 | 12/2005 | Karabacak et al. | |
| 2017/0104060 A1* | 4/2017 | Balakrishnan | H01L 29/0673 |
| 2017/0323949 A1* | 11/2017 | Loubet | H01L 29/42392 |
| 2018/0047835 A1 | 2/2018 | Chao et al. | |
| 2018/0342427 A1* | 11/2018 | Xie | H01L 21/823878 |
| 2019/0067434 A1* | 2/2019 | Zhou | H01L 21/3065 |
| 2019/0103472 A1* | 4/2019 | Cheng | H01L 29/42392 |
| 2019/0189766 A1* | 6/2019 | Loubet | H01L 29/42392 |
| 2019/0214311 A1* | 7/2019 | Seshadri | H01L 21/3081 |
| 2019/0237336 A1* | 8/2019 | Wang | H01L 27/0688 |
| 2019/0280107 A1* | 9/2019 | Ando | H01L 29/66795 |
| 2019/0304848 A1* | 10/2019 | Cheng | H01L 27/1211 |
| 2019/0305104 A1* | 10/2019 | Xie | H01L 29/66553 |
| 2019/0312120 A1* | 10/2019 | Zhang | H01L 21/823462 |
| 2019/0355851 A1* | 11/2019 | Seshadri | H01L 21/823412 |

* cited by examiner

100

100

100

PATTERNING METHOD FOR NANOSHEET TRANSISTORS

TECHNICAL FIELD

The field generally relates to semiconductor devices and methods of manufacturing same and, in particular, to forming n-type field-effect transistor (nFET) and p-type field-effect transistor (pFET) nanosheet transistor devices with different work function metals on a substrate.

BACKGROUND

Nanosheet devices can be viable device options instead of fin field-effect transistors (FinFETs). For example, nanowires or nanosheets can be used as the fin structure in a dual-gate, tri-gate or gate-all-around (GAA) FET device. Complementary metal-oxide semiconductor (CMOS) scaling can be enabled by the use of stacked nanowires and nanosheets, which offer superior electrostatics and higher current density per footprint area than FinFETs. Additionally, nanosheet devices are being pursued as a viable device option for the 5 nm node and beyond. Nanosheet formation relies on the selective removal of one semiconductor (e.g., silicon germanium (SiGe)) with respect to another (e.g., silicon (Si)) to form the nanosheet and GAA structures.

Work function metal (WFM) removal in nanosheet processing requires extensive over-etching to remove WFM layers between nanosheets. In connection with adjacent n-type and p-type nanosheet devices (e.g., nFETs and pFETs), a first type nanosheet device (e.g., n-type) is typically formed by etching the opposite type (e.g., p-type) WFM on the first type side and subsequently depositing the first type WFM to replace the removed opposite type WFM. However, when using conventional methods, the etching of the opposite type WFM on the first type side also damages and causes unwanted removal of part of the opposite type WFM on the opposite type side. As a result, conventional lateral etch processes undesirably limit the minimum distance between n-type and p-type nanosheet devices, and undesirably limit the width of nanosheets.

Due to increased device density and longer nanosheet widths being employed in many applications (e.g., static random-access memory (SRAM)), reduced distance between n-type and p-type nanosheet devices is required. Accordingly, there is a need for improved methods for WFM removal in nanosheet processing which allows for reduction of the distance and between n-type and p-type nanosheet devices and increased nanosheet width.

SUMMARY

According to an exemplary embodiment of the present invention, a method for manufacturing a semiconductor device includes forming a first plurality of stacked nanosheet portions on a substrate in a first region corresponding to a first type, and forming a second plurality of stacked nanosheet portions on the substrate in a second region corresponding to a second type. The second plurality of stacked nanosheet portions are spaced apart from the first plurality of stacked nanosheet portions. In the method, a plurality of work function metal layers are formed to be alternatingly stacked with the first and second plurality of stacked nanosheet portions in the first and second regions and on the substrate adjacent to and in the space between the first and second plurality of stacked nanosheet portions. The plurality of work function metal layers correspond to the second type. The method further includes forming a plurality of mask layers covering the plurality of alternatingly stacked work function metal layers, and removing portions of the plurality of work function metal layers from areas on the substrate adjacent to and in the space between the first and second plurality of stacked nanosheet portions to create a plurality of openings. An organic planarization layer is formed in at least part of the plurality of openings and in the second region covering the second plurality of stacked nanosheet portions. Portions of the plurality of work function metal layers not covered by the organic planarization layer are removed, and the removed portions of the plurality of work function metal layers are replaced with an additional plurality of work function metal layers corresponding to the first type.

According to an exemplary embodiment of the present invention, a semiconductor device includes a first type nanosheet device having a first plurality of nanosheet portions alternately stacked with a first plurality of work function metal layers on a substrate, and a second type nanosheet device having a second plurality of nanosheet portions alternately stacked with a second plurality of work function metal layers on the substrate. The second type nanosheet device is spaced apart from the first type nanosheet device. The semiconductor device also includes a dielectric layer disposed in the space between the first and second type nanosheet devices. The first and second plurality of work function metal layers are directly disposed on the dielectric layer, and bottom surfaces of the directly disposed first and second plurality of work function metal layers are co-planar with each other.

According to an exemplary embodiment of the present invention, a method for manufacturing a semiconductor device includes forming a first plurality of stacked channel portions on a substrate in a first region corresponding to a first type, and forming a second plurality of stacked channel portions on the substrate in a second region corresponding to a second type. The second plurality of stacked channel portions are spaced apart from the first plurality of stacked channel portions. In the method, a plurality of work function metal layers are formed to be alternatingly stacked with the first and second plurality of stacked channel portions in the first and second regions and on the substrate adjacent to and in the space between the first and second plurality of stacked channel portions. The plurality of work function metal layers correspond to the second type. The method further includes forming a plurality of mask layers covering the plurality of alternatingly stacked work function metal layers, and removing a portion of the plurality of work function metal layers from an area on the substrate in the space between the first and second plurality of stacked channel portions to create an opening. An organic planarization layer is formed in at least part of the opening and in the second region covering the second plurality of stacked channel portions. Portions of the plurality of work function metal layers not covered by the organic planarization layer are removed, and the removed portions of the plurality of work function metal layers are replaced with an additional plurality of work function metal layers corresponding to the first type.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
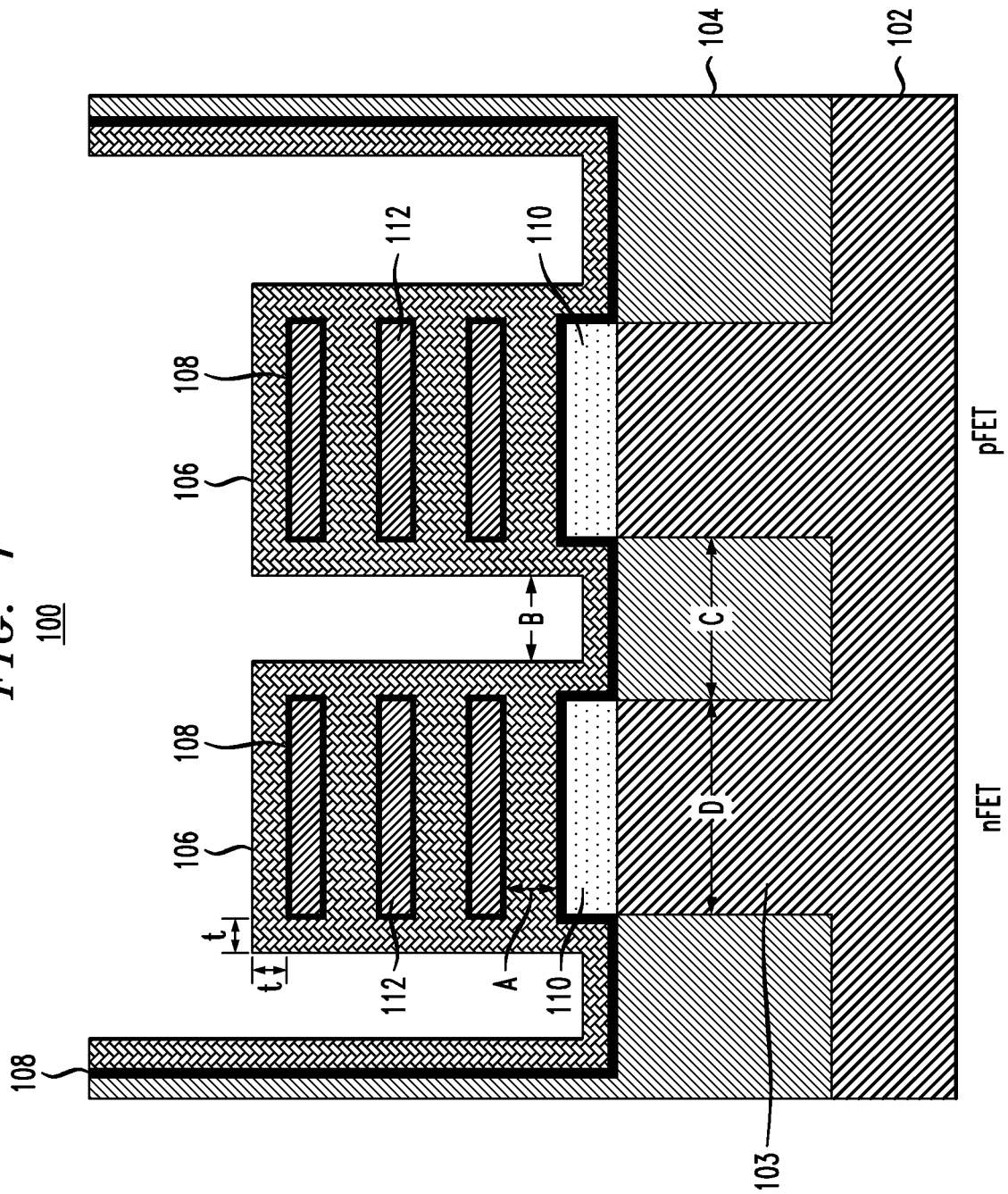
FIG. 1 is a cross-sectional view illustrating replacement metal gate (RMG) work function metal (WFM) deposition in a method of manufacturing a semiconductor device, according to an exemplary embodiment of the present invention.

Exemplary embodiments of the invention will now be discussed in further detail with regard to semiconductor devices and methods of manufacturing same and, in particular, to forming n-type and p-type nanosheet transistor devices with different WFMs. An OPL is deposited to completely cover a WFM in either the p-type or n-type region so that the WFM can be removed from the region not protected by the OPL without removing or damaging the WFM in the covered region.

It is to be understood that the various layers and/or regions shown in the accompanying drawings are not drawn to scale, and that one or more layers and/or regions of a type commonly used in, for example, nanowire FET, nanosheet FET, FinFET, vertical FET (VFET), CMOS, field-effect transistor (FET), metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, nanowire FETs, nanosheet FETs, FinFETs, VFETs, CMOSs, FETs, SETs, and/or MOSFETs. By way of non-limiting example, the semiconductor devices can include, but are not necessarily limited to nanowire FET, nanosheet FET, FinFET, VFET, CMOS, FET, SET, CMOS and MOSFET devices, and/or semiconductor devices that use nanowire FET, nanosheet FET, FinFET, VFET, CMOS, FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with one or more embodiments of the present invention, hardmask and OPL layers are utilized to protect an n-type or p-type WFM during RMG processing for nanosheet devices. More specifically, a hardmask covers portions of a WFM during a first etching process to remove parts of the WFM. The WFM removal during the first etching process enables complete coverage by the OPL of a WFM in either a p-type or n-type region. The OPL is deposited to completely cover the WFM in either the p-type or n-type region so that during a subsequent etch process, the WFM is removed from the region not protected by the OPL and not removed from or damaged in the covered region. As a result, reduced distance between n-type and p-type nanosheet devices and increased nanosheet width can be achieved.

Although embodiments of the present invention are discussed in connection with nanosheet stacks, the embodiments of the present invention are not necessarily limited thereto, and may similarly apply to nanowire stacks.

FIG. 1 is a cross-sectional view illustrating replacement metal gate (RMG) work function metal (WFM) deposition in a method of manufacturing a semiconductor device, according to an exemplary embodiment of the present invention. Referring to FIG. 1, a semiconductor device 100 includes two opposite type nanosheet devices (e.g., nFET and pFET) formed spaced apart from each other on a substrate 102. In accordance with an embodiment of the present invention, whether the devices are n-type or p-type is controlled by work function metal (WFM) selection as discussed further herein.

Each device includes a plurality of nanosheet channel portions 112 in an alternating stacked configuration with a WFM 106. The WFM 106 is formed in layers in the alternating stacked configuration with the channel portions 112 for each of the nFET and pFET nanosheet devices. The WFM 106 is further formed on sides of the stacked channel portions 112, and on dielectric isolation layers 104 (e.g., shallow trench isolation (STI) layers) located in trenches in the substrate 102 to the side of and between the nFET and pFET nanosheet devices. Each channel portion 112 is surrounded by a high-k dielectric layer 108 positioned between the layers of WFM 106 and the corresponding channel portion 112.

The nFET and pFET nanosheet devices further include a bottom isolation layer 110 under the stacked configuration of the channel portions 112 alternating with the layers of WFM 106 and positioned on respective pedestal portions 103 of the substrate 102. The pedestal portions 103 are surrounded by the dielectric isolation layer 104. The high-k dielectric layer 108 is further formed on the dielectric layer 104 and on each of the bottom isolation layers 110 between the WFM 106 and the dielectric layer 104 and each of the bottom isolation layers 110. In accordance with an embodiment of the present invention, the illustrated nanosheet devices nFET and pFET correspond to n-type and p-type devices, respectively. However, the embodiments of the present invention are not necessarily limited thereto, and may correspond to p-type and n-type devices, respectively. The nanosheet devices nFET and pFET, including the pedestal portions 103, dielectric layers 104, bottom isolation layers 110, the stacked configuration of the channel portions 112 alternating with the WFM 106, and the high-k dielectric layers 108, are formed by processes for forming nanosheet and/or nanowire devices known to those of ordinary skill on the art.

In accordance with an embodiment of the present invention, the channel portions 112, pedestal portions 103 and substrate 102 comprise semiconductor material including, but not necessarily limited to, silicon (Si), silicon germanium (SiGe), II-V compound semiconductor or other like semiconductor. While three channel portions 112 are shown, the embodiments of the present invention are not necessarily limited to the shown number of channel portions 112, and there may be more or less layers in the same alternating configuration with the WFM 106 depending on design constraints. In a non-limiting example, a height of the channel portions 112 can be in the range of about 5 nm-about 15 nm depending on the desired process and application. In accordance with an embodiment of the present invention, each of the channel portions 112 has the same or substantially the same composition and size as each other. In a non-limiting example, as shown by arrow A, a distance between the high-k dielectric layers 108 on the bottom isolation layer 110 and on the bottom channel portion 112 is about 8 nm to about 9.5 nm. In a non-limiting example, as shown by arrow B, a distance between the WFM 106 on the nanosheet stacks between n-type and p-type regions is about 15 nm to about 40 nm, for example about 26 nm. In a non-limiting example, as shown by arrow C, a width of the pedestal portions 103 is about 15 nm to about 40 nm. In a non-limiting example, as shown by arrow D, a distance between the pedestal portions 103 of the n-type and p-type regions (or a width of the isolation region 104 between the n-type and p-type regions) is about 33 nm to about 35 nm.

The WFM 106 is conformally deposited using, for example, atomic layer deposition (ALD), chemical vapor deposition (CVD) or other conformal deposition technique, and includes, but is not necessarily limited to, titanium nitride (TiN), tantalum nitride (TaN), ruthenium (Ru), titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN or TaN. For example, according to an embodiment, the WFM 106 is a p-type WFM including TiN, and has a thickness t of about 2 nm to about 6 nm, for example about 4.5 nm. Alternatively, the WFM 106 is an n-type WFM including a stack of TiN/TiC/TiN, and has a thickness t of about 2 nm to about 6 nm, for example about 4.5 nm (5 angstroms TiN, 30 angstroms TiC and 10 angstroms TiN). The embodiments are described in connection with the deposition of a p-type WFM (e.g. WFM 106) on both nFET and pFET regions and removal of the p-type WFM from the nFET region. It is to be understood that the embodiments of the present invention are not necessarily limited thereto, and may apply to the deposition of an n-type WFM on both nFET and pFET regions and removal of the n-type WFM from the pFET region. In the latter case, the WFM 106 would be an n-type instead of a p-type, the OPL 130 described in connection with FIG. 5 would cover the nFET region instead of the pFET region, and the WFM 140 deposited in connection with FIG. 8 would be a p-type instead of an n-type.

The high-K dielectric layers 108 include, but are not necessarily limited to, $HfO_x$ (hafnium oxide (e.g., $HfO_2$)), $ZrO_2$ (zirconium dioxide), hafnium zirconium oxide, $Al_2O_3$ (aluminum oxide), and $Ta_2O_5$ (tantalum V oxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In a non-limiting example, a thickness of the high-k dielectric layer 108 is about 1 nm to about 3 nm, for example, about 1.7 nm.

The bottom isolation layers 110 include, but are not necessarily limited to, a stacked structure of an oxide/nitride/oxide, with an overall thickness of about 4 nm to about 16 nm (about 1-about 3 nm oxide, about 2 nm-about 10 nm nitride and about 1-about 3 nm oxide), for example, 10 nm (2 nm oxide, 6 nm nitride and 2 nm oxide). In accordance with an embodiment of the present invention, the dielectric isolation layer 104 comprises, but is not necessarily limited to, silicon oxide ($SiO_x$), where x is, for example, 1.99, 2, 2.01), low-temperature oxide (LTO), high-temperature oxide (HTO), flowable oxide (FOX) or some other dielectric.

Figure 2:
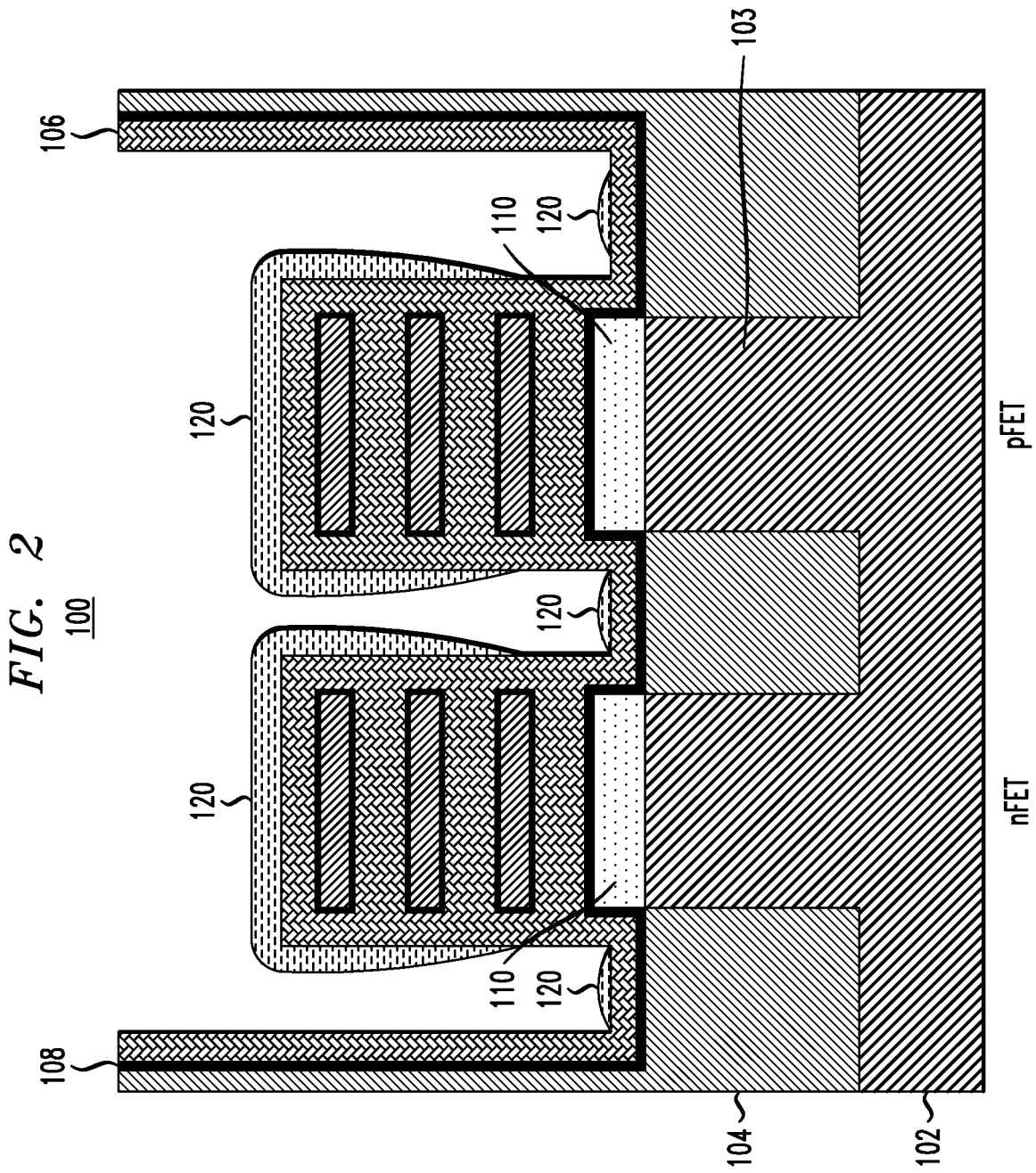
FIG. 2 is a cross-sectional view illustrating mask layer deposition in a method of manufacturing a semiconductor device, according to an exemplary embodiment of the present invention.

FIG. 2 is a cross-sectional view illustrating mask layer deposition in a method of manufacturing a semiconductor device, according to an exemplary embodiment of the present invention. Referring to FIG. 2, mask layers 120, such as hard mask layers, are deposited on the WFM layers 106 on the sides and on top of the stacked nanosheet devices including the nanosheet channel portions 112 alternately stacked with the layers of WFM 106. In addition, mask layers 120 may also be deposited on the WFM layers 106 between and/or adjacent the stacked nanosheet devices. Mask layers 120 are further shown in FIG. 2 on the WFM layers 106 between and adjacent the stacked nanosheet devices. If mask layers are also deposited on the WFM layers 106 between and/or adjacent the stacked nanosheet devices, a thickness of the mask layers 120 on top of the WFM layers 106 between and/or adjacent the stacked nanosheet devices is less than thicknesses of the mask layers 120 on the WFM 106 on the sides and on top of the stacked nanosheet devices so that in the subsequent etching described in connection with FIG. 3, the WFM 106 on the sides and on top of the stacked nanosheet devices is protected, while portions of the WFM layers 106 between and/or adjacent the stacked nanosheet devices are able to be exposed after removal of the thinner mask layers 120 and then removed. As can be seen in FIG. 2, there may be portions of the mask layers 120 on the lower sides of the stacked nanosheet devices that taper down to the same or a smaller thickness than the thickness of the mask layers 120 on top of the WFM layers 106 between and adjacent the stacked nanosheet devices. However, due to the downward directional etching described in connection with the FIG. 3 herein, the tapered structure of the mask layers 120 does not compromise the protective effect of the mask layer 120 on the WFM layers 106 on the sides and on top of the stacked nanosheet devices.

The mask layer 120 is deposited using, for example, radio-frequency physical vapor deposition (RF-PVD), and comprises, for example, a nitride including, but not necessarily limited to, silicon nitride (SiN), silicon boron nitride (SiBN), siliconborocarbonitride (SiBCN), silicon oxycarbonitride (SiOCN) or other dielectric.

Figure 3:
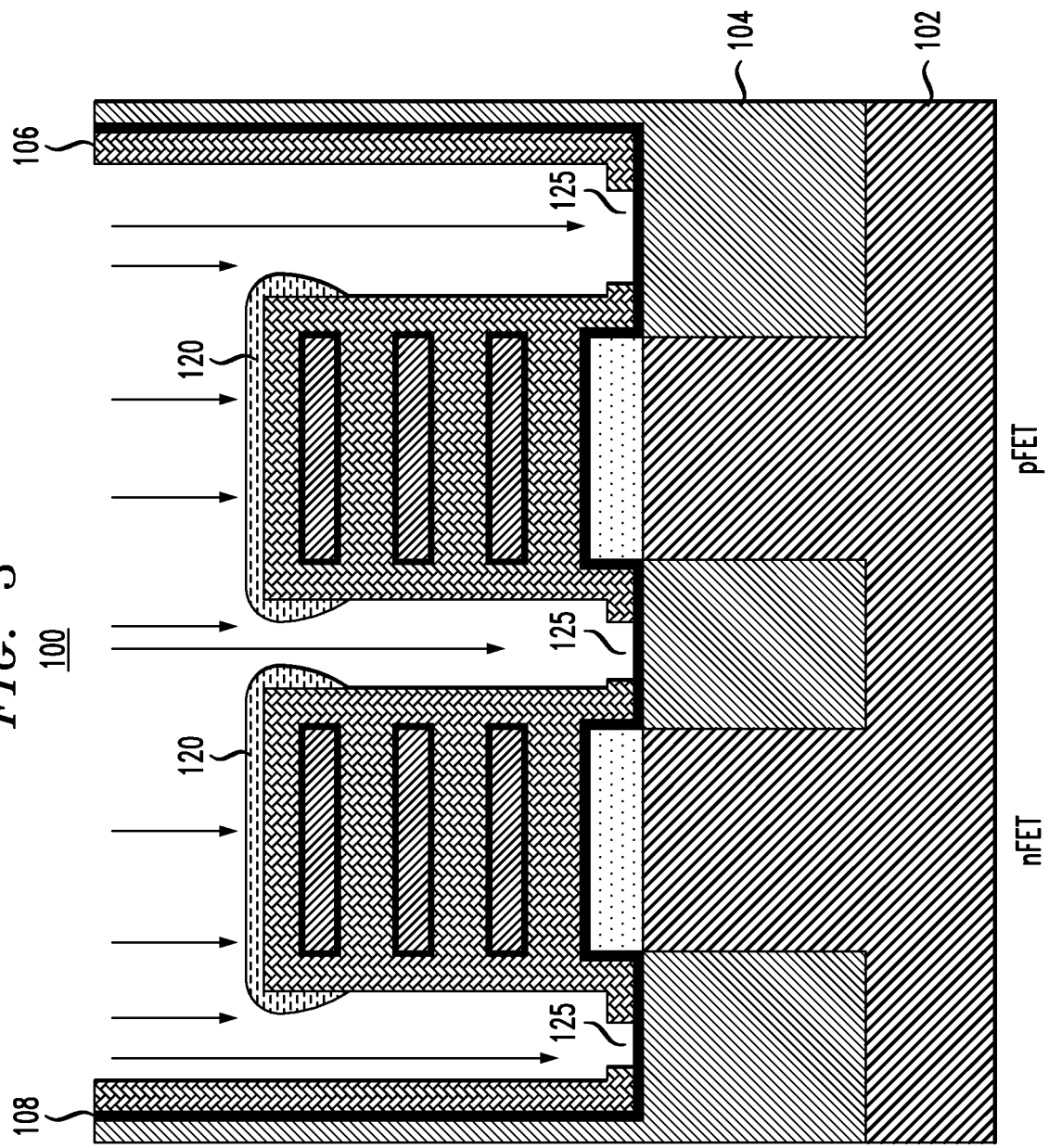
FIG. 3 is a cross-sectional view illustrating removal of portions of a deposited WFM in a method of manufacturing a semiconductor device, according to an exemplary embodiment of the present invention.

FIG. 3 is a cross-sectional view illustrating removal of portions of a deposited WFM in a method of manufacturing a semiconductor device, according to an exemplary embodiment of the present invention. Referring to FIG. 3, as shown by the downward facing arrows, gas cluster ion beam (GCIB) removal processes or directional (anisotropic) reactive ion etching (RIE) processes are performed in a downward vertical direction to remove thinner mask layers 120 between and adjacent the stacked nanosheet devices, and then remove exposed portions of the WFM layers 106 between and adjacent the stacked nanosheet devices to create openings 125 exposing part of the high-K dielectric layers 108 on the dielectric isolation layers 104 between step portions of the WFM 106. In accordance with one or more embodiments of the present invention, directional RIE based etching is used for each of the mask and WFM layers 120 and 106. For example, the RIE for the mask layers 120 uses $SF_6$, $CHF_3$, $Cl_2$, $O_2$, $CF_4$, Ar, $BCl_3$ and/or $N_2$ based plasma, and the RIE for the WFM layers 106 uses $Ar/CHF_3$, $Ar/Cl_2$ or $Ar/BCl_3$ based plasma. In the case of the downward directional removal, the difference in thicknesses between the mask layers 120 on the WFM layers 106 between and/or adjacent the stacked nanosheet devices and the mask layers 120 on the WFM 106 on the sides and on top of the stacked nanosheet devices permits removal of the lower mask layers 120 to expose the portions of the WFM layer where the openings 125 are formed, while the remaining portions of the mask layer 120 cover and protect from removal the WFM 106 on the sides and on top of the stacked nanosheet devices.

Figure 4:
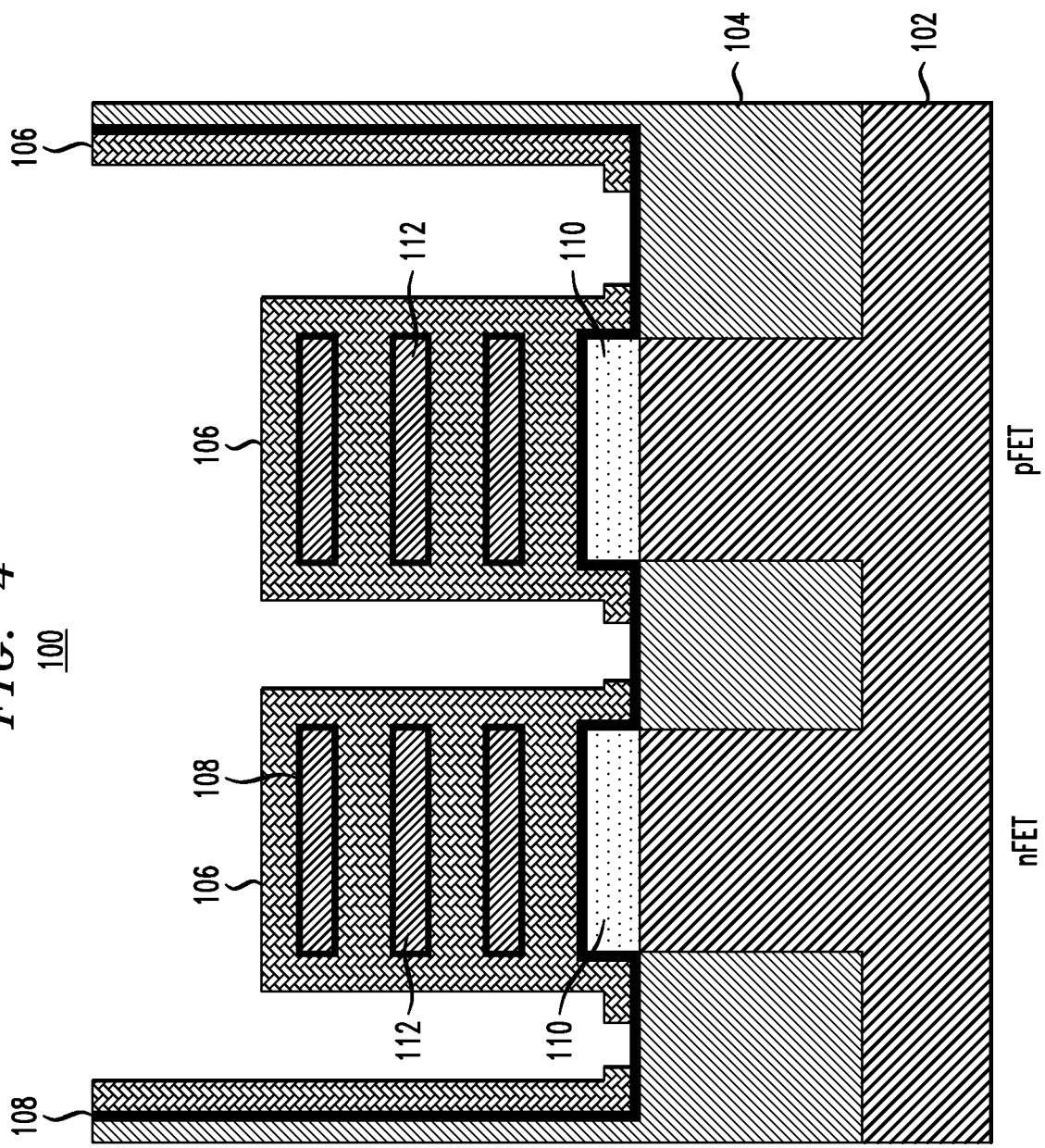
FIG. 4 is a cross-sectional view illustrating mask layer removal in a method of manufacturing a semiconductor device, according to an exemplary embodiment of the present invention.

FIG. 4 is a cross-sectional view illustrating mask layer removal in a method of manufacturing a semiconductor device, according to an exemplary embodiment of the present invention. Referring to FIG. 4, remaining portions of the mask layer 120 on the WFM 106 on the sides and on top of the stacked nanosheet devices are removed using, for example, RIE with $SF_6$, $CHF_3$, $Cl_2$, $O_2$, $CF_4$, Ar, $BCl_3$ and/or $N_2$ based plasma.

Figure 5:
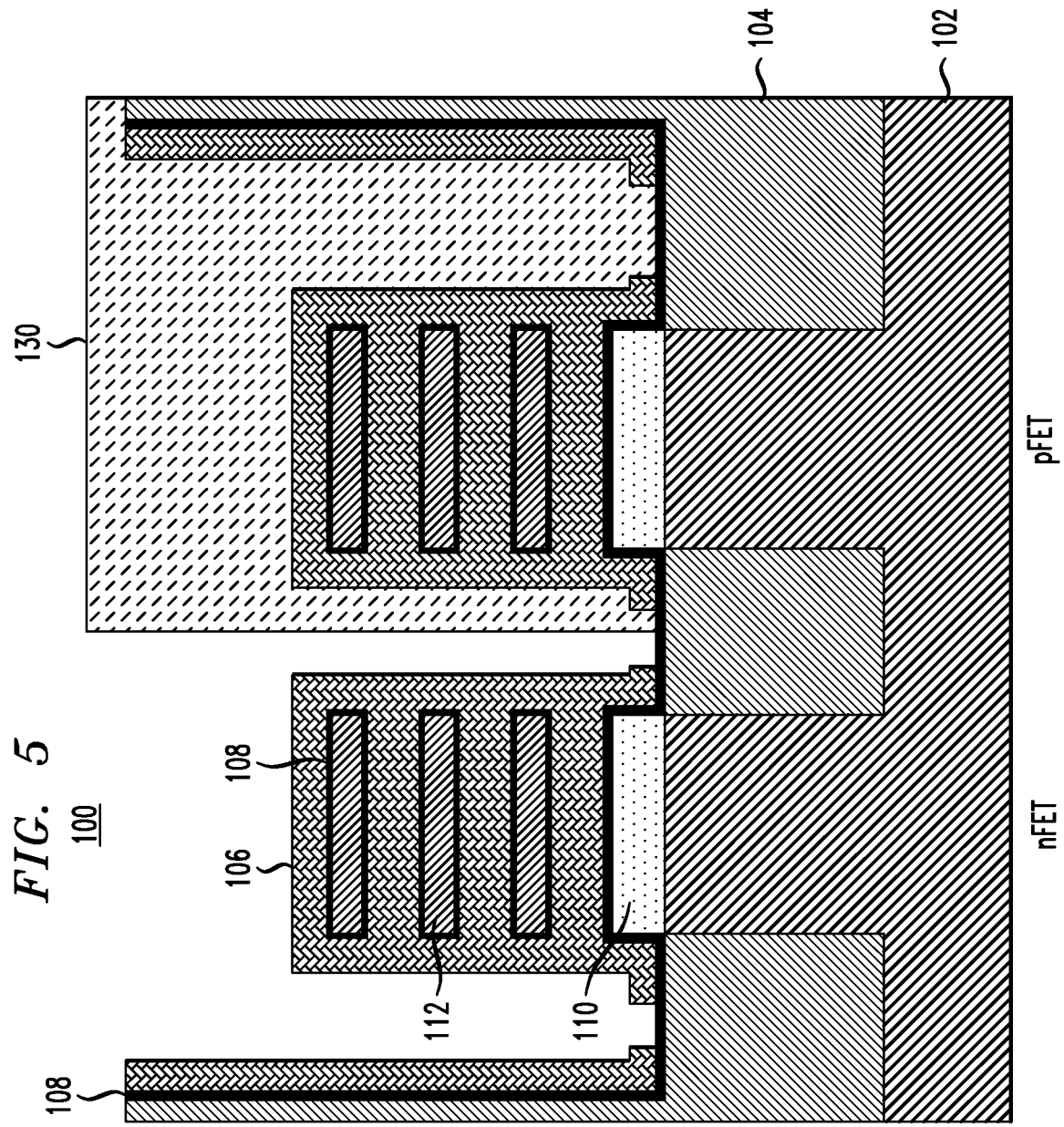
FIG. 5 is a cross-sectional view illustrating formation of an organic planarization layer (OPL) on a p-type region of a nanosheet device in a method of manufacturing a semiconductor device, according to an exemplary embodiment of the present invention.

FIG. 5 is a cross-sectional view illustrating formation of an organic planarization layer (OPL) on a p-type region of a nanosheet device in a method of manufacturing a semiconductor device, according to an exemplary embodiment of the present invention. Referring to FIG. 5, an OPL 130 is formed in the pFET region on the nanosheet device, on portions of WFM layers 106 adjacent the nanosheet device, and on the high-k dielectric layer 108 in the openings 125 around the pFET region. As can be seen in FIG. 5, by resting directly on top of the dielectric layer 108, the bottom surfaces of the OPL layer 130 are in line (e.g., co-planar) with the bottom surfaces of the WFM layers 106, which are also directly on top of the dielectric layer 108. The OPL layer 130 completely encapsulates the nanosheet device including the nanosheet channel portions 112 alternately stacked with the layers of WFM 106 on the pFET side. As a result, no portions of the WFM layers 106 on the pFET nanosheet device are vulnerable (e.g., exposed) to an etchant which is used to remove the WFM layers 106 in the opposite device region (e.g., nFET region) not covered by the OPL 130 (see FIG. 6). The OPL comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 130 can be deposited, for example, by spin coating. According to one or more embodiments of the present invention, the lithography overlay margin in connection with the OPL 130 is less than about 13 nm. If the lithography overlay margin is greater than about 13 nm, then there is an increased chance that the OPL 130 will not completely cover the WFM layers 106 on the pFET nanosheet device, resulting in subsequent damage to the WFM layers 106 in the p-type region during the exposed WFM removal discussed in connection with FIG. 6.

Figure 6:
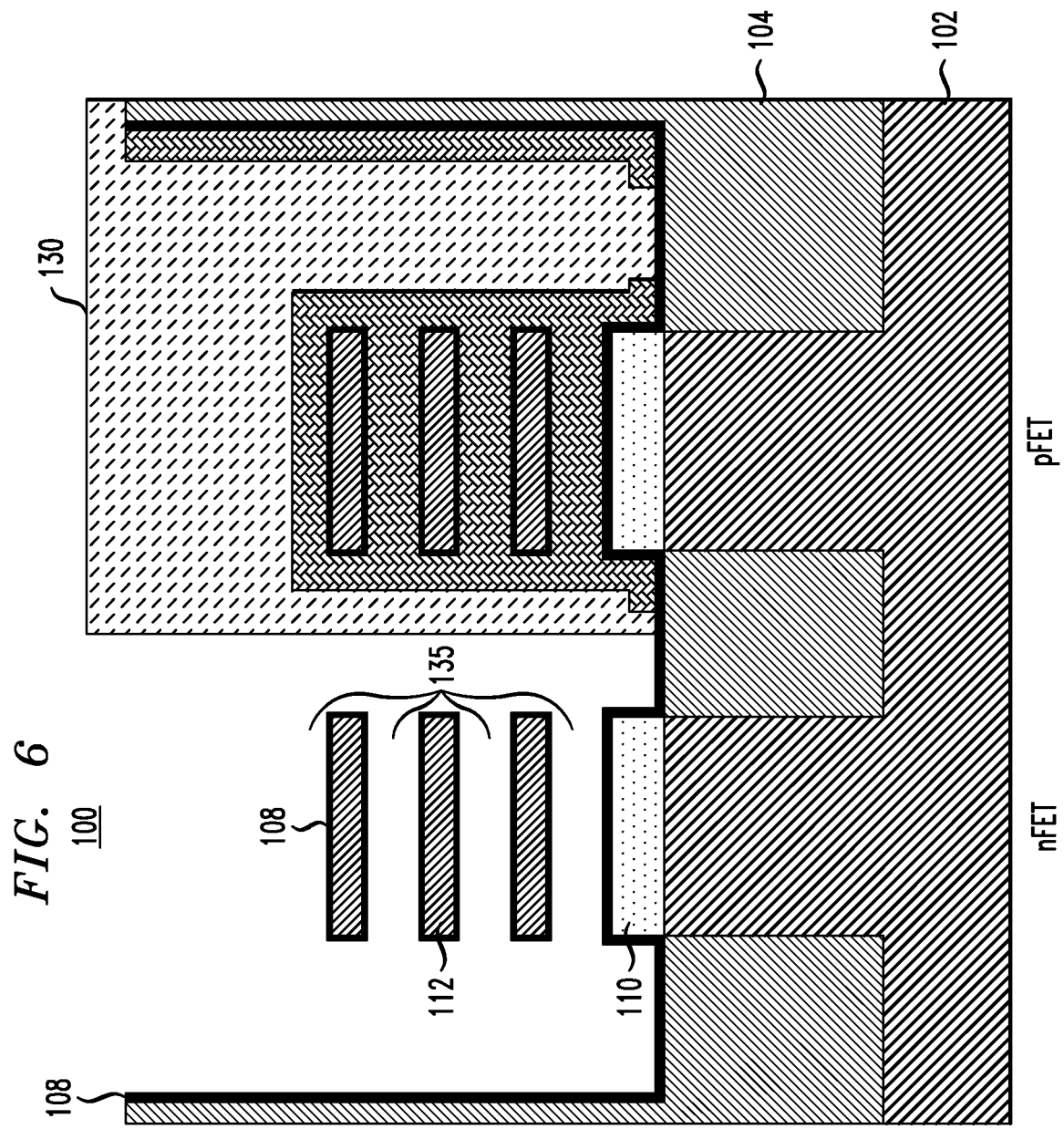
FIG. 6 is a cross-sectional view illustrating removal of exposed portions of a WFM from an n-type region of a nanosheet device in a method of manufacturing a semiconductor device, according to an exemplary embodiment of the present invention.

FIG. 6 is a cross-sectional view illustrating removal of exposed portions of a WFM from an n-type region of a nanosheet device in a method of manufacturing a semiconductor device, according to an exemplary embodiment of the present invention. Referring to FIG. 6, using, for example, an etching process with room temperature SC1 (NH$_4$OH:H$_2$O$_2$:H$_2$O) (RT SC1), the exposed WFM layers 106 are selectively removed from the nFET region with respect to the high-k dielectric layers 108 to create vacant regions 135 where a different WFM than that in the p-type region can be deposited. The WFM to be added to the n-type region is selected to result in an n-type device. The WFM layers 106 corresponding to the pFET nanosheet device P in the p-type region are well protected by the OPL 130 so that extended WFM over-etching can be employed to remove the exposed surfaces of the WFM layers 106 in the n-type region without causing any damage to the WFM layers 106 in the p-type region.

Figure 7:
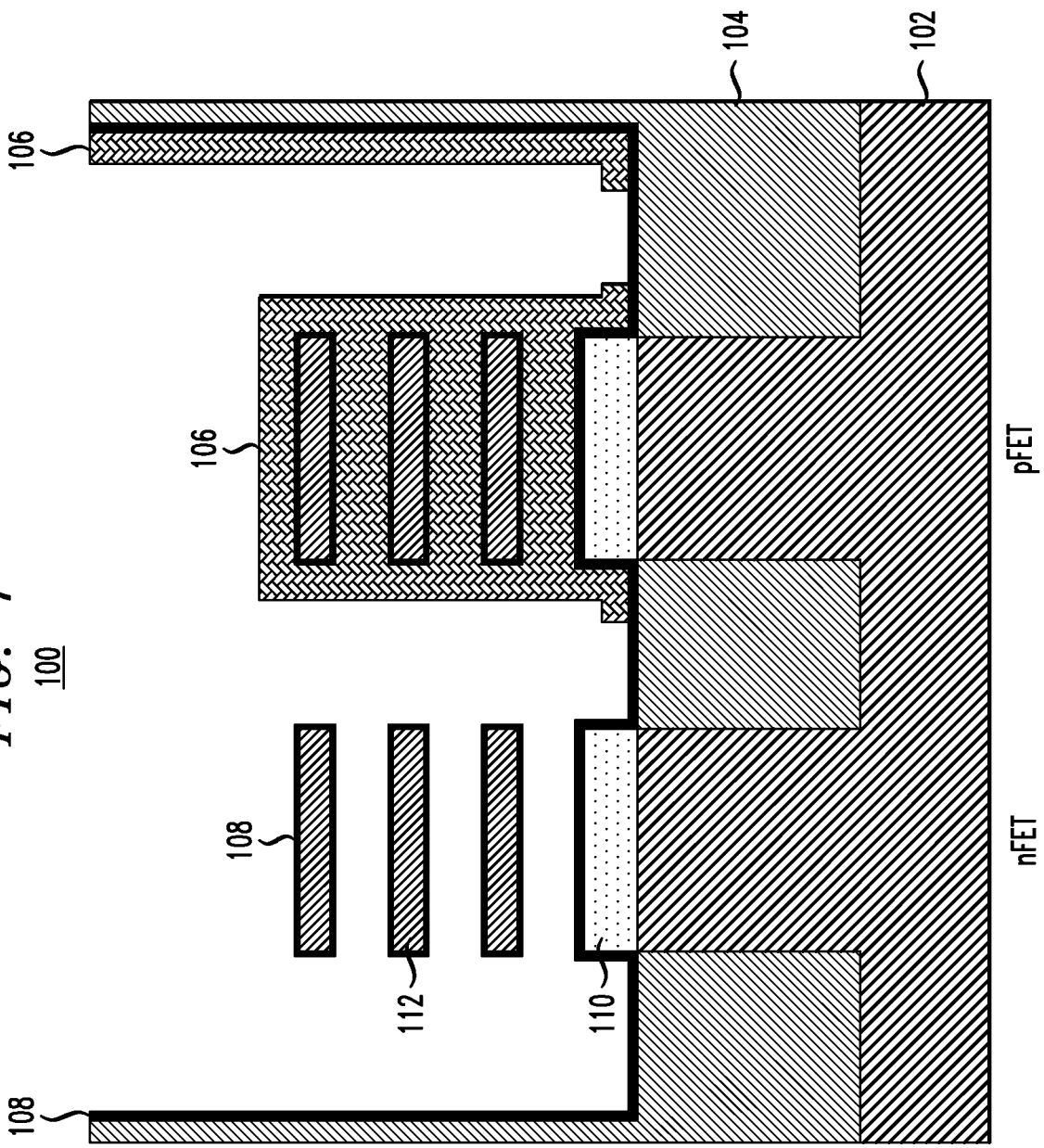
FIG. 7 is a cross-sectional view illustrating OPL removal in a method of manufacturing a semiconductor device, according to an exemplary embodiment of the present invention.

FIG. 7 is a cross-sectional view illustrating OPL removal in a method of manufacturing a semiconductor device, according to an exemplary embodiment of the present invention. Referring to FIG. 7, the OPL 130 is stripped using, for example, oxygen plasma, nitrogen plasma, hydrogen plasma or other carbon strip or ashing process. The stripping process causes minimal or no damage to the remaining layers.

Figure 8:
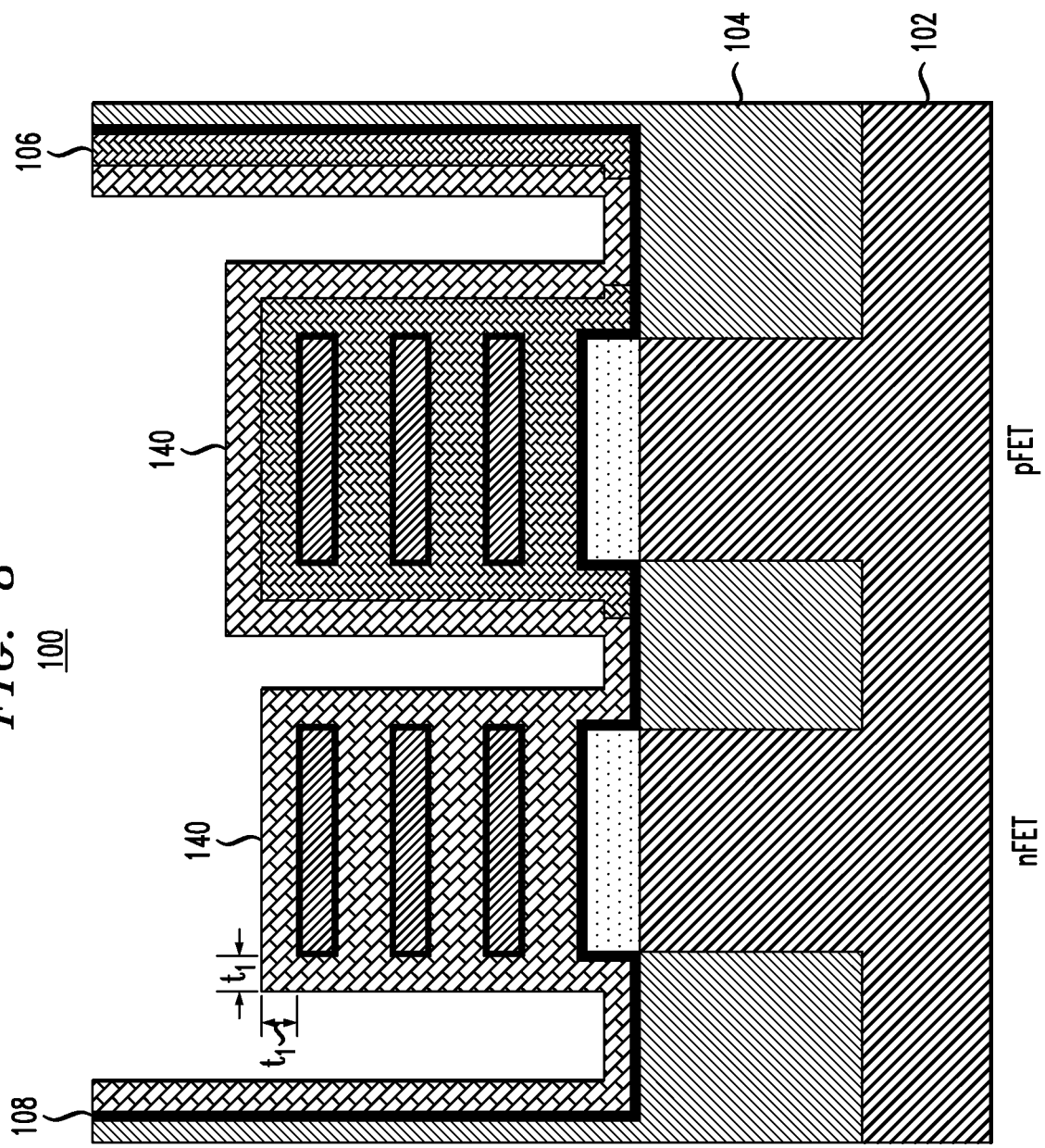
FIG. 8 is a cross-sectional view illustrating WFM deposition in a method of manufacturing a semiconductor device, according to an exemplary embodiment of the present invention.

FIG. 8 is a cross-sectional view illustrating WFM deposition in a method of manufacturing a semiconductor device, according to an exemplary embodiment of the present invention. Referring to FIG. 8, the WFM 140 is conformally deposited on exposed surfaces, including on and between nanosheet channels 112 in the nFET region, and on WFM 106 of the nanosheet device in the pFET region. The WFM 140 is deposited using, for example, ALD, CVD or other conformal deposition technique, and includes, but is not necessarily limited to, TiN, TaN, Ru, TiAlN, TiAlCN, TiC, TiAlC, TaAlC, TaAlCN or La doped TiN or TaN. For example, according to an embodiment, the WFM 140 is an n-type WFM including a stack of TiN/TiC/TiN, and has a thickness $t_1$ of about 3 nm to about 9 nm (about 5 angstroms-about 10 angstroms TiN, about 20 angstroms-about 50 angstroms TiC and about 5 angstroms-about 30 angstroms TiN). For example, the WFM 140 has a thickness of 4.5 nm (5 angstroms TiN, 30 angstroms TiC and 10 angstroms TiN). As shown in FIG. 8, bottom surfaces of the WFM 140 on the high-k dielectric layer 108 in the openings 125 are co-planar with bottom surfaces of the WFM 106 on the high-k dielectric layer 108 between and/or adjacent the stacked nanosheet devices. Part of the WFM 140 is also conformally formed on a step portions of the WFM 106 adjacent and on sides of the p-type nanosheet device.

As noted above, the embodiments are described in connection with the deposition of a p-type WFM (e.g. WFM 106) on both nFET and pFET regions, removal of the p-type WFM from the nFET region, and subsequent deposition of an n-type WFM in the nFET region. It is to be understood that the embodiments of the present invention are not necessarily limited thereto, and may apply to the deposition of an n-type WFM on both nFET and pFET regions, removal of the n-type WFM from the pFET region, and subsequent deposition of a p-type WFM in the pFET region.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a first plurality of stacked nanosheet portions on a substrate in a first region corresponding to a first type;
   forming a second plurality of stacked nanosheet portions on the substrate in a second region corresponding to a second type, wherein the second plurality of stacked nanosheet portions are spaced apart from the first plurality of stacked nanosheet portions;
   forming a plurality of work function metal layers alternatingly stacked with the first and second plurality of stacked nanosheet portions in the first and second regions and on the substrate adjacent to and in a space between the first and second plurality of stacked nanosheet portions, wherein the plurality of work function metal layers correspond to the second type;
   forming a plurality of mask layers covering the plurality of alternatingly stacked work function metal layers;
   removing portions of the plurality of work function metal layers from areas on the substrate adjacent to and in the space between the first and second plurality of stacked nanosheet portions to create a plurality of openings;
   forming an organic planarization layer in at least part of the plurality of openings and in the second region covering the second plurality of stacked nanosheet portions;
   removing portions of the plurality of work function metal layers not covered by the organic planarization layer; and
   replacing the removed portions of the plurality of work function metal layers with an additional plurality of work function metal layers corresponding to the first type.

2. The method according to claim 1, further comprising:
   forming at least one mask layer on one or more of the plurality of work function metal layers on the substrate adjacent to and in the space between the first and second plurality of stacked nanosheet portions;
   wherein the at least one mask layer is thinner than at least a portion of the plurality of mask layers covering the plurality of alternatingly stacked work function metal layers.

3. The method according to claim 2, further comprising removing the at least one mask layer prior to removing the portions of the plurality of work function metal layers to create the plurality of openings.

4. The method according to claim 1, wherein removing the portions of the plurality of work function metal layers to create the plurality of openings is performed using directional removal process.

5. The method according to claim 4, wherein the directional removal process comprises one of a gas cluster ion beam process and a directional reactive ion etching process.

6. The method according to claim 1, further comprising removing the plurality of mask layers prior to forming the organic planarization layer.

7. The method according to claim 1, further comprising removing the organic planarization layer prior to replacing the removed portions of the plurality of work function metal layers with the additional plurality of work function metal layers.

8. The method according to claim 1, wherein the organic planarization layer in the at least part of the openings is formed directly on a dielectric layer.

9. The method according to claim 8, wherein the dielectric layer comprises a high-K dielectric layer.

10. The method according to claim 1, wherein the first type is n-type and the second type is p-type.

11. The method according to claim 1, wherein the replacing of the removed portions of the plurality of work function metal layers with the additional plurality of work function metal layers is performed using a conformal deposition process.

12. A semiconductor device, comprising:
a first type nanosheet device comprising a first plurality of nanosheet portions alternately stacked with a first plurality of work function metal layers on a substrate;
a second type nanosheet device comprising a second plurality of nanosheet portions alternately stacked with a second plurality of work function metal layers on the substrate, wherein the second type nanosheet device is spaced apart from the first type nanosheet device; and
a dielectric layer disposed in a space between the first and second type nanosheet devices;
wherein the first and second plurality of work function metal layers are directly disposed on the dielectric layer; and
wherein bottom surfaces of the first and second plurality of work function metal layers directly disposed on the dielectric layer are co-planar with each other.

13. The semiconductor device according to claim 12, wherein the dielectric layer comprises a high-k dielectric layer.

14. The semiconductor device according to claim 12, wherein the high-k dielectric layer is disposed on a dielectric isolation region in the substrate.

15. The semiconductor device according to claim 12, wherein, in the space between the first and second type nanosheet devices, a portion of second work function metal layer of the second plurality of work function metal layers is disposed on a step portion of a first work function metal layer of the first plurality of work function metal layers.

16. A method for manufacturing a semiconductor device, comprising:
forming a first plurality of stacked channel portions on a substrate in a first region corresponding to a first type;
forming a second plurality of stacked channel portions on the substrate in a second region corresponding to a second type, wherein the second plurality of stacked channel portions are spaced apart from the first plurality of stacked channel portions;
forming a plurality of work function metal layers alternatingly stacked with the first and second plurality of stacked channel portions in the first and second regions and on the substrate adjacent to and in a space between the first and second plurality of stacked channel portions, wherein the plurality of work function metal layers correspond to the second type;
forming a plurality of mask layers covering the plurality of alternatingly stacked work function metal layers;
removing a portion of the plurality of work function metal layers from an area on the substrate in the space between the first and second plurality of stacked channel portions to create an opening;
forming an organic planarization layer in at least part of the opening and in the second region covering the second plurality of stacked channel portions;
removing portions of the plurality of work function metal layers not covered by the organic planarization layer; and
replacing the removed portions of the plurality of work function metal layers with an additional plurality of work function metal layers corresponding to the first type.

17. The method according to claim 16, further comprising:
forming at least one mask layer on the portion of the plurality of work function metal layers in the space between the first and second plurality of stacked channel portions;
wherein the at least one mask layer is thinner than at least a portion of the plurality of mask layers covering the plurality of alternatingly stacked work function metal layers.

18. The method according to claim 17, further comprising removing the at least one mask layer prior to removing the portion of the plurality of work function metal layers to create the opening.

19. The method according to claim 16, further comprising removing the plurality of mask layers prior to forming the organic planarization layer.

20. The method according to claim 16, wherein the organic planarization layer in the at least part of the opening is formed directly on a dielectric layer.

* * * * *